US008711600B2

(12) United States Patent
Venkataraman et al.

(10) Patent No.: US 8,711,600 B2
(45) Date of Patent: Apr. 29, 2014

(54) HIGH DENSITY MOLECULAR MEMORY STORAGE WITH READ AND WRITE CAPABILITIES

(75) Inventors: Karthik Venkataraman, Cambridge, MA (US); Jagadeesh S. Moodera, Sommerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 81 days.

(21) Appl. No.: 13/423,520

(22) Filed: Mar. 19, 2012

(65) Prior Publication Data

US 2013/0100724 A1  Apr. 25, 2013

Related U.S. Application Data

(60) Provisional application No. 61/550,970, filed on Oct. 25, 2011.

(51) Int. Cl.
*G11C 11/22* (2006.01)

(52) U.S. Cl.
USPC ............ 365/145; 365/171; 257/295; 257/421

(58) Field of Classification Search
USPC ........................ 365/145, 171; 257/295, 421
See application file for complete search history.

(56) References Cited

U.S. PATENT DOCUMENTS

| 7,166,881 | B2 * | 1/2007 | Lin et al. ........................ 257/295 |
| 2002/0186514 | A1 * | 12/2002 | Childress et al. .......... 360/324.2 |
| 2011/0149670 | A1 | 6/2011 | Heo et al. |
| 2012/0313191 | A1 * | 12/2012 | Whig et al. .................... 257/421 |

FOREIGN PATENT DOCUMENTS

WO    2008130465 A2    10/2008

OTHER PUBLICATIONS

Semenov et al., "Electrically controlled magnetic switching based on graphene-magnet composite structures" Journal of Applied Physics, American Institute of Physics, New York, US vol. 107, No. 6, Mar. 30, 2010, pp. 64507-64507 XP 012133769.

Semenov et al., "Electrically controlled magnetic memory and programmable logic based on graphene/ferromagnet hybrid structures" Device Research Conference, 2009, Jun. 22, 2009, pp. 141-142, XP031581312.

Semenov et al., "Electrical Control of Exchange Bias Mediated by Graphene" Physical Review Letters, No. 101, Oct. 3, 2008, pp. 147206-1-147206-4.

Karpan et al., "Graphite and Graphene as Perfect Spin Filters" Physical Review Letters, No. 99, 176602, Oct. 26, 2007, XP002679141pp. 176602-1-177602-4.

(Continued)

*Primary Examiner* — Connie Yoha
(74) *Attorney, Agent, or Firm* — Gesmer Updegrove LLP

(57) ABSTRACT

A memory element is provided that includes a ferromagnetic (FM) layer having one or more ferromagnetic materials. One or more first molecule layers are positioned on the FM layer where charge transfer and interface chemistry between the one or more first molecule layers and FM layer induces a magnetic moment in the one or more first molecule layers. The magnetic moment is stored in the one or more first molecule layers acting as bit information that is retained or written into the one or more first molecule layers. One or more spin-filter layers are positioned on the one or more first molecule layers. The one or more spin-filter layers are positioned on the one or more spin-filter layers to form a physical or a chemical π-dimer layer structure.

24 Claims, 10 Drawing Sheets

(56) References Cited

OTHER PUBLICATIONS

International Search Report and Written Opinion issued in connection with PCT Case No. PCT/US2012/029624 mailed on Jul. 26, 2012.

Wende, "Substrate-induced magnetic ordering and switching of iron porphrin molecules" Nature Materials, vol. 6, Jul. 2007, pp. 516-520.

Mannini et al., "Magnetic memory of a single-molecule quantum magnet wired to a gold surface" Nature Materials, vol. 8, Mar. 2009, pp. 194-197.

\* cited by examiner

HIGH DENSITY MOLECULAR MEMORY STORAGE WITH READ AND WRITE CAPABILITIES

SPONSORSHIP INFORMATION

This invention was made with government support under Grant No. N00014-09-1-0177 awarded by the Office of Naval Research and under Grant No. DMR-0504158 awarded by the National Science Foundation. The government has certain rights in this invention.

PRIORITY INFORMATION

This application claims priority from provisional application Ser. No. 61/550,970 filed Oct. 25, 2011, which is incorporated herein by reference in its entirety.

BACKGROUND OF THE INVENTION

The invention is related to the filed of memory storage devices, and in particular to a high density molecular memory storage and read and write apparatus.

The electron spin, an intrinsic magnetic moment derived from quantum mechanics, has been a fascinating subject of interest; playing an important role in our everyday life. Utilizing these spin states in electronics has lead to the field of spintronics that has revolutionized the realm of data storage, sensing and power applications, providing major technological impacts to the life of people. The discovery of giant magnetoresistance (GMR) effect, used in a read-head sensors in hard drives has allowed to increase the storage density to ~1 Tbyte/inch' and more. This field received a special recognition with a Nobel prize for Physics in 2007. Currently, there is an increased activity from materials research perspective to understand and develop spintronics devices using new interesting materials like, carbon nanotubes, graphene, topological insulators and also organic semiconductors (OSs) for technological applications.

SUMMARY OF THE INVENTION

According to one aspect of the invention, there is provided a memory element for use in a memory storage device. The memory element includes a ferromagnetic (FM) layer having one or more ferromagnetic materials and one or more first molecule layers. The one or more first molecule layers are positioned on the FM layer where charge transfer and interface chemistry between the one or more first molecule layers and FM layer induces a magnetic moment in the one or more first molecule layers. The magnetic moment is stored in the one or more first molecule layers acting as bit information that is retained or written into the one or more first molecule layers. One or more spin-filter layers are positioned on the one or more first molecule layers. The one or more spin-filter layers are positioned on the one or more spin-filter layers to form a physical or a chemical π-dimer layer structure.

According to another aspect of the invention, there is provided a method of forming a memory element for use in a memory storage device. The method includes providing a ferromagnetic (FM) layer having one or more ferromagnetic materials. Also, the method includes forming one or more first molecule layers that is positioned on the FM layer where charge transfer and interface chemistry between the one or more first molecule layers and FM layer induces a magnetic moment in the one or more first molecule layers. The magnetic moment is stored in the one or more first molecule layers acting as bit information that is retained or written into the one or more first molecule layers. Moreover, the method includes bonding the one or more spin-filter layers to the one or more spin-filter layers to form a physical or a chemical π-dimer structure.

According to another aspect of the invention, there is provided a method of storing bit information in a memory element. The method includes providing a ferromagnetic (FM) layer having one or more ferromagnetic materials. Also, the method includes inducing a magnetic moment in one or more first molecule layers that are positioned on the FM layer through charge transfer and interface chemistry between the one or more first molecule layers and FM layer. The magnetic moment stored in the one or more first molecule layers acting as said bit information that is retained or written into the one or more first molecule layers. Moreover, the method includes bonding the one or more spin-filter layers to the one or more first molecule layers in order to form a physical or a chemical π-dimer layer structure.

DETAILED DESCRIPTION OF THE INVENTION

The invention is a novel form of a storage or memory access device using organic or organo-metallic molecules, which can belong to the category of open shell graphene fragments. Each molecule on a ferromagnet substrate acts as a memory element allowing high storage density. The spin-filter molecule over the interface molecule, that together form a bilayer molecular structure, is used for read and write capabilities. Also, such devices can be useful for future quantum processing techniques. The same device design could hold for inorganic systems i.e. spin-filter layer on a memory element which can provide read/write capabilities.

Figure 1:
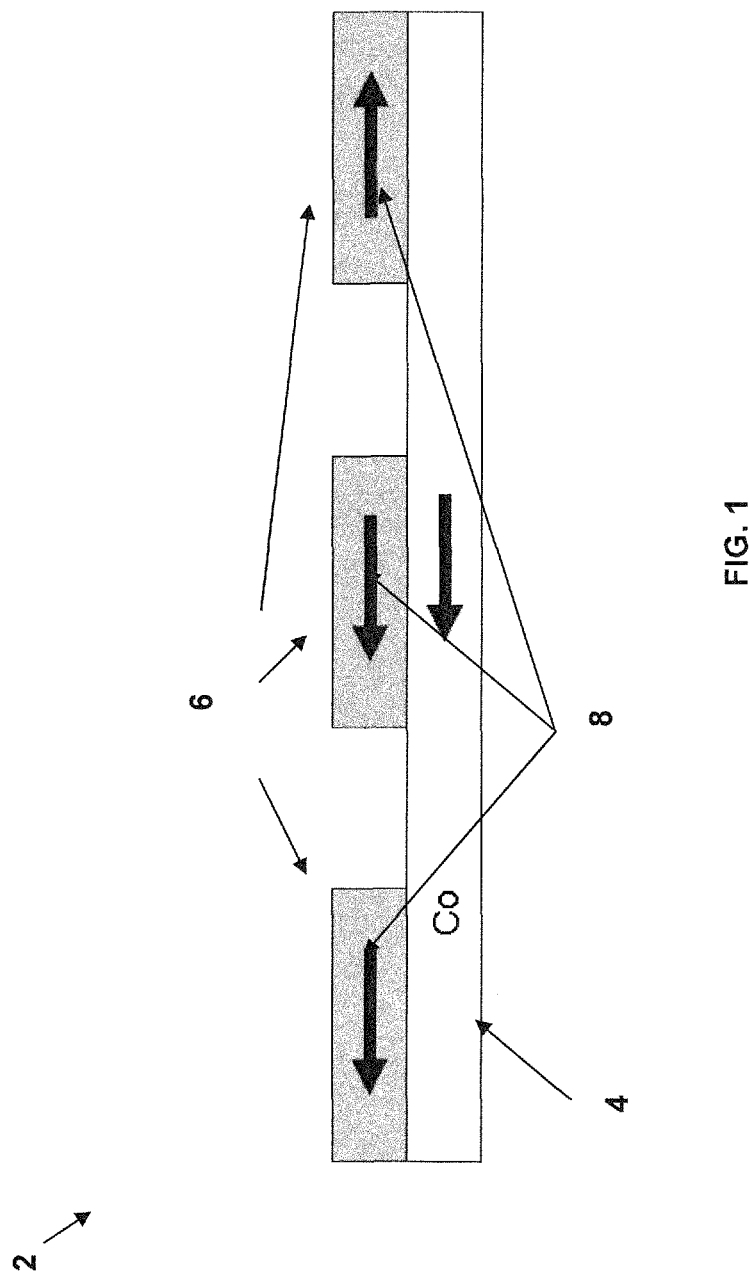
FIG. 1 is a schematic diagram illustrating a memory element used in accordance with the invention.

FIG. 1 is a schematic diagram illustrating a memory element 2 used in accordance with the invention. The memory element 2 includes a number of single magnetic or non-magnetic planar molecule layers 6 on a ferromagnetic (FM) layer 4, such as Co, Fe, Ni or other magnetic alloys, magnetic oxides, transition metals, or sulphides with transition metals. Charge transfer and interface chemistry between the molecule layers 6 and the FM layer 4 induces magnetic moment 8 in the molecule layers 6, where a large magnetic field is required to switch the magnetic moment 8 induced in the molecule layers 6. The moment 8 stored in the molecule layers 6 act as a bit of information that can be retained for a long period of times since spin relaxation in molecules is very weak. Hence, they are potential for storing information.

The stored bit can be written or changed by switching the orientation of the moment in the molecule layer 6 using electromagnetic fields either by applying an external magnetic field or by applying high voltage that modifies interface chemistry conditions reversibly or by passing a spin polarized current that applies significant torque on the moment 8 of the molecule layers 6 and switch its orientation. This idea of a memory element 2 is different than those in the prior art regarding molecular memory because they deal primarily with single molecular magnets containing a transition atom which carries the moment. It is important to note that one can apply the invention to the class of magnetic or non-magnetic planar phenalenyl derivatives or graphene fragment molecules which become magnetic due to interface chemistry hybridization effects. The presence of the FM layer 4 should not be confused with the magnetic memory element which is the molecule. The role of the FM layer 4 is to induce the moment 8 on the molecule layer 6 and create a magnetic anisotropy in the molecule defining the molecule layers 6. The origin of magnetic anisotropy in the molecule could be due to FM-molecule magnetic exchange coupling or due to spin-orbit coupling induced anisotropy or due to other interface chemistry mechanisms. Hence, the molecule layers 6 can store information in bit 0 or bit 1 state irrespective of the magnetization of the FM layer 4. In principle, the molecule layers 6 need not store only two bits i.e. 0 (magnetization in left direction) or 1 (magnetization in right direction). Multi-level spin states can be stabilized due to induced magnetic anisotropy and hence multilevel information can be stored on each bit allowing much higher storage capacities. The molecular layers 6 can also represent a weakly interacting quantum mechanical entangled state or qubits.

Figure 2A:
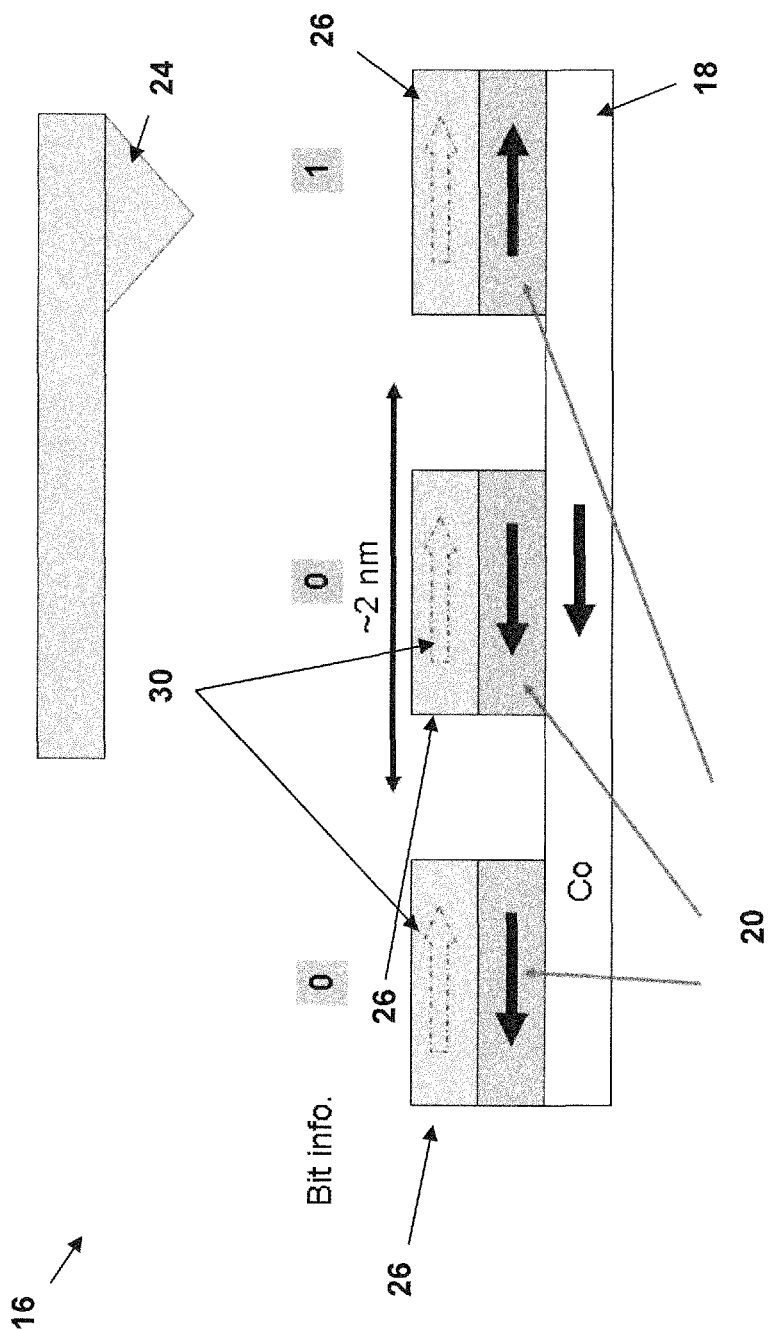
FIGS. 2A-2B are schematic diagrams illustrating a reading and writing apparatus used in accordance with the invention.

FIG. 2A is a schematic diagram illustrating an embodiment a reading and writing apparatus 16 used in accordance with the invention. The reading and writing apparatus 16 includes a FM layer 18 and a number of single planar molecule layers 20 positioned on the FM layer 18 as discussed in FIG. 1. Second molecule layers or a spin-filter layers 26, may or may not be the same molecule as the planar molecule layers 20, bonds to the single planar molecule layers 20 forming a physical or a chemical π-dimer layer. A conducting fly 24 tip similar to an AFM tip or an STM tip scans across the film and map the resistance or current across the area of the magnetic storage medium. Importantly, the tip 24 is non magnetic and hence this idea is different than the prior art where the use of a magnetic tip is proposed. Making magnetic tips is not straightforward and adds cost to building one. On the other hand, making conducting non magnetic tips are easy.

Figure 2B:
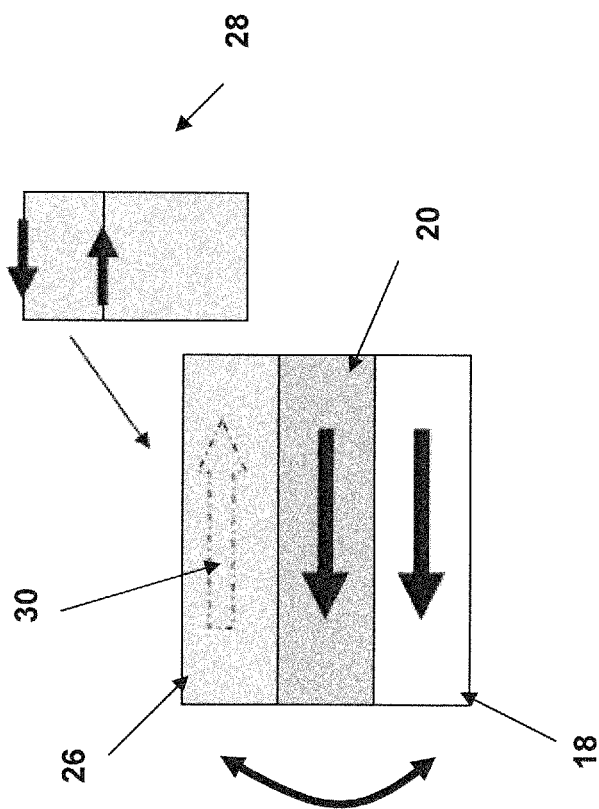

The spin-filter layer 26 can or cannot be magnetic, but importantly, it has a splitting in the molecular energy level for the two electron spin channels 28, as shown in FIG. 2B. The molecule defining the spin-filter layer 26 creates a barrier height for tunneling. Hence, the current passing though the spin-filter layer 26 is polarized in the direction corresponding to the lower energy level in the molecule. The dotted arrow 30 shown in the spin-filter layer 26 corresponds to this low energy spin channel.

The orientation of the spin channels 28 (preferred lower energy spin channel) in the spin-filter layer 26 is dictated by the magnetization of the FM layer 18. This happens due to interface chemistry and hybridization creating an indirect exchange interaction between the FM layer 18 and the spin-filter layer 26. Both anti-parallel alignment and parallel alignment between the spin-filter layer 26 and the FM layer 18 is possible depending on the structure/chemistry of the molecule used. For now it is assumed that an anti-parallel alignment is preferred. Further, the spin filtering properties of the spin-filter layer 26 can be modulated by switching the FM layer 18. Importantly, the magnetic field needed to switch the FM layer 18 is much lower than the coercivity of the molecular layers 20 created due to the induced magnetic anisotropy. The difference in resistance arises due to difference in the tunneling barrier height for the two spin channels. Such a response has been shown in experiments for a certain molecular film stacked between a FM electrode and a non-magnetic electrode, which is discussed later.

Relative orientation between a molecule layer 20 and the spin-filter layer 26 corresponds to high and low resistance state of the device. For simplicity, one can assume the parallel state to be the low resistance state and anti-parallel state to be the high resistance state, although the reverse is also possible. Hence as the tip 24 scans on the above bits, the bit 0 will be high resistance state while bit 1 will be the low resistance state.

Figure 3B:
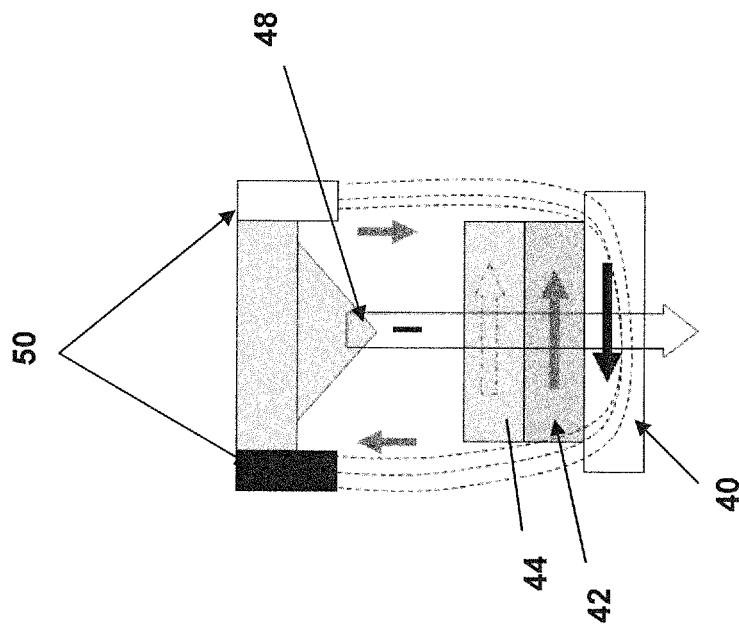
FIGS. 3A-3B are schematic diagrams illustrating the writing process used in accordance with the invention.
Figure 3A:
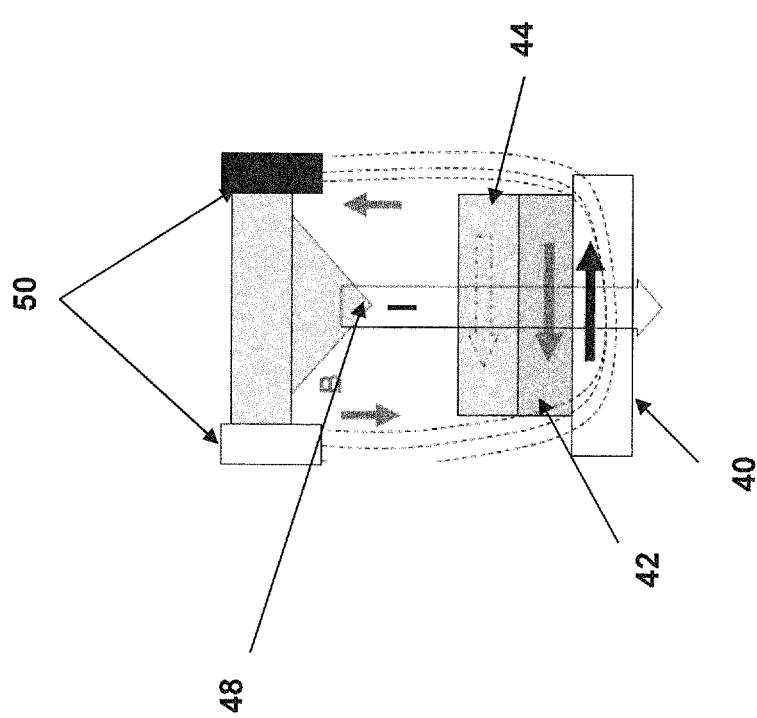

Writing information in the molecular layers 20 in a particular orientation could be done in two possible ways. High bias voltage from the AFM tip can reversibly modify the interface chemistry and magnetism conditions effectively switching the moment of the molecular layer 20. Secondly, it could be done by passing a high current density I of that spin channel through a molecule layer 42 using a tip 48, as shown in FIG. 3A. The current exerts a torque on the moment and writes information. As shown in the FIG. 3A or FIG. 3B, if one wants to write a bit 0, an electromagnetic force, produced by magnets 50 producing a magnetic field B, is applied on a bottom FM layer 40 which orients a spin-filter layer 44 along the direction parallel to the orientation of the magnetic information to be stored in the molecule layer 42. Writing a bit is done in parallel orientation between the molecular layer 42 and the spin-filter layer 44. This makes sure that the polarization of the tunneling current is in the same direction as the bit to be written. The size and the position of the magnetic coil has no limitation. It could be a part of the conducting fly 24 tip or a part of the bottom substrate. Any other source of electromagnetic force is also conceivable.

For high storage density, a single bit is represented by a single molecule ~1-1.5 nm. Hence storage density of close to $10^{15}$/inch$^2$ is possible. The multilevel spin states (can or can not be) within the molecule also allow scaling up and for quantum storage and computing. Spin relaxation in molecules is very weak. Hence it is possible to use molecules with low Z materials that significantly increase the data life in such materials. Intermolecular coupling is weak hence no crosstalk. Information can be retained for a very long time. Large near room temperature MR has been observed in such materials that show possibility of room temperature applications in the future. As a result, the manufacturing cost is cheap and can be a future technology to realize such high storage densities. No magnetic tip is needed for use in storage or RAM devices, but can be used in other embodiments. Rather than a conducting fly tip 24, a cross-bar architecture using metallic or molecular interconnects to realize non-volatile RAM is also included in this idea.

Figure 4B:
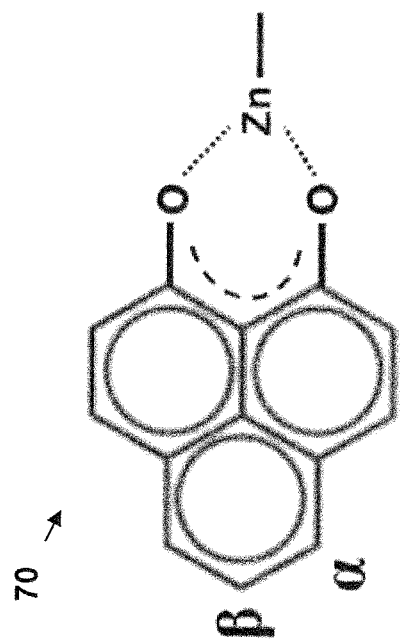
FIGS. 4A-4F are schematic diagrams and graphs illustrating organic spin-valves (OSVs) and their respective performance.
Figure 4A:
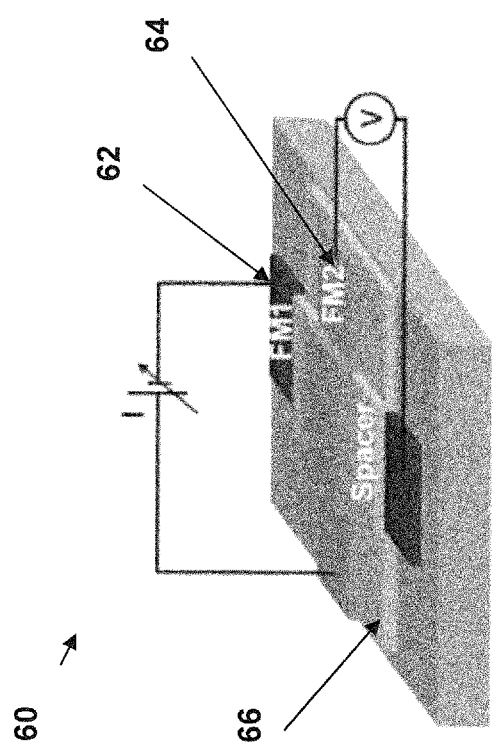

Use of nanoscale molecular systems as electronic materials is providing exciting new avenues for next generation quantum electronic devices in information processing, sensing and storage. This is possible by virtue of the flexibility in designing tailor-made molecular materials using chemical synthesis, allowing a countless potential to meet the application specific functional needs in electronic structure and spin properties. For example, such synthetic efforts are currently being adopted in designing molecular magnets, molecular memory for "bits" in magnetic storage, and in tailoring the interface properties between a ferromagnet (FM) and an organic molecule for the development of molecular spintronic devices like the organic magnetic tunnel junctions (OMTJs) and organic spin-valves (OSVs), as shown in FIG. 4A. These devices are formed using two FM electrodes 62, 64, separated by an organic film as the spacer layer 66 in OSVs and as a tunnel barrier in OMTJs. The resistance in such devices change with an applied magnetic field, termed as magnetoresistance (MR), which depends on the relative magnetization of the two FM electrodes 62, 64 and the efficiency of spin tunneling and spin diffusive transport through the spacer layer 66.

Unfortunately, disorder in the organic spacer layer 66 and at the interface have limited MR response in the device 60, making them currently challenging for room temperature technological applications. However, consider that one can construct a device 60 such that the MR response is dominated only by the interface and be completely independent of the disorder and other bulk spin scattering mechanisms. Such devices open up the possibility to build novel functional nanomolecular devices by simply engineering the interface characteristics. The invention progresses in this direction towards realization of a new molecular device showing a large interface magnetoresistance (IMR) effect.

Interaction between a FM and a π-conjugated organic molecule, constituting an interface, is a complex phenomenon. Chemical modification of the interface due to charge transfer and hybridization of the $p_z$ atomic-type orbital in the molecule with the d-states of a FM layer create new hybrid metal-organic interface states which directly affect the electronic and magnetic properties of the adsorbed molecule. Moreover, these interactions depend strongly on the specific molecular structure influencing the spin injection efficiency and spin polarization at the interface. The invention relies on a new form of interface phenomena using an adsorbed open-shell phenalenyl derivative, zinc methyl phenalenyl (ZMP, $C_{14}H_{10}O_2Zn$), as molecular templates on the surface of a FM layer that modify the interface chemistry and magnetism, leading to a spin-filter effect which explains the measured IMR response.

Phenalenyl are special ligands that belong to the class of open-shell delocalized radical species that hold promise as building blocks for the construction of quantum qubit devices where the unpaired electron serves as information carrier. These ligands are easily amenable to chemical modifications allowing the synthesis of tailor-made phenalenyl derivatives where the ligand can stabilize into a cation (non-magnetic positive ion), radical (magnetic unit due to one unpaired electron) or an anion (non-magnetic negative ion) state. In the case of ZMP 70, the presence of two electronegative oxygen atoms O causes the molecule to be neutral with no net spin, as shown in FIG. 4B. This is confirmed from the diamagnetic response of ZMP using SQUID. As a result, the compound is less reactive than its radical counterpart which tend to form π-dimers. However, due to the interaction of the molecule with FM surface, the molecule can develop a net moment and hence exist in a partial radical state and further interact with another molecule forming a special donor-acceptor π-type dimers. Presence of such an interface mechanism is pivotal in the observation of spin-filter effect.

Figure 4D:
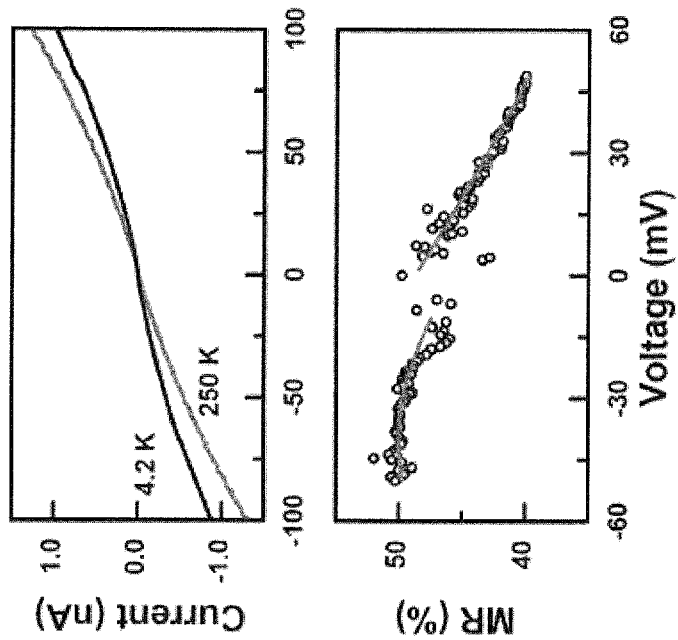
Figure 4C:
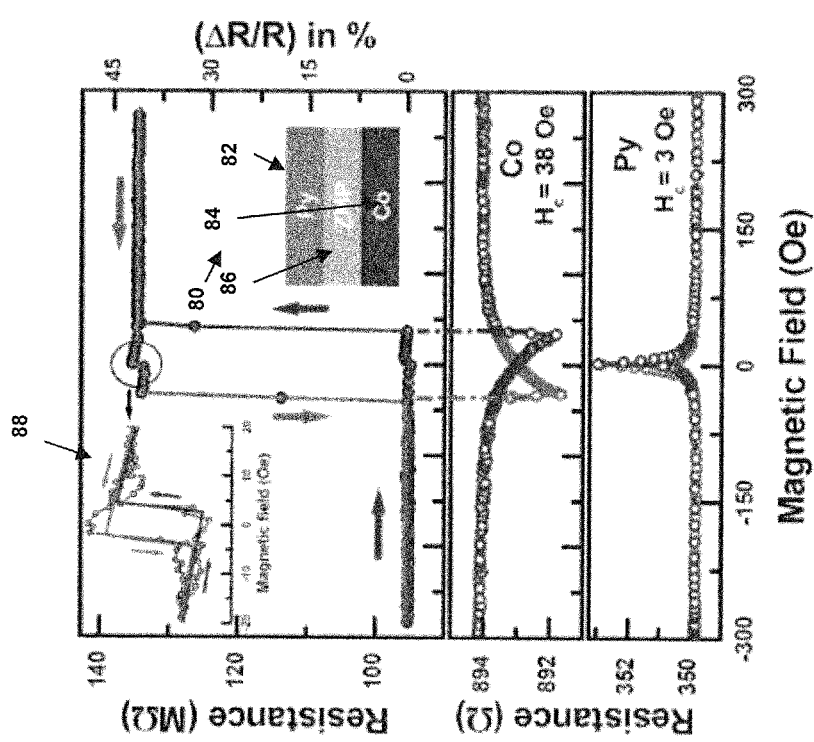

FIG. 4C shows the magnetotransport measurements on a vertical OSV 80 with 35 nm of ZMP as the spacer layer 86 between Co and permalloy (Py) FM electrodes 82, 84. The device 80 resistance and current-voltage (I-V) characteristics are checked before performing magnetotransport measurements to ensure non-linear response, as shown FIG. 4D. The device 80 is cooled down to 4.2 K in a magnetic field of ~−500 Oe. A large MR of 42% is observed with sharp switching at ±38 Oe. The MR response is very stable and reproducible with repeated scans. Moreover, a flat response of the MR with applied voltage bias (low bias) is observed with a maximum MR of 50%. The observation of higher MR in negative bias suggests signs of voltage-induced magnetoelectric effect that enhance the interface spin polarization at the FM surface. Anisotropy magnetoresistance (AMR) study on the two FM electrodes, Py and Co, gives a coercivity of 3 Oe and 38 Oe, respectively.

The above observations are very interesting. Typically, the MR response in a vertical spin-valve device 80 involves a complete MR loop with the two switching happening at the corresponding coercive field of the two FM electrodes 82, 84, as shown in FIG. 4A. This response is indicative of a spin diffusive transport of electrons through the spacer layer 86 between the two FM electrodes 82, 84 acting as the spin polarizer/analyzer. However, the half-MR response in the device 80 suggest that the abrupt change in the device resistance is caused only by the switching of the bottom Co electrode 84 (spin polarizer) with respect to a hard magnetic layer (spin analyzer), either at the interface or within the bulk of ZMP film. The role of top Py electrode 82 is not evidently noted in these measurements. However, when a careful scan is performed around the zero field, a second independent half-MR loop with switching at the coercivity of Py (3 Oe) is revealed, as shown in inset 88. The presence of the two separate half-MR loops strongly suggest that the MR is an interface effect with the two electrodes 82, 84 switching independently with respect to a magnetically hard layer at their respective interfaces. Bulk magnetism in ZMP can be ruled out based on the diamagnetic state of the molecules. Further, the larger IMR signal for the bottom interface compared to the top interface can be understood due to several possible reasons: favorable interface conditions with Co or sharper bottom interface leading to a larger interface resistance limiting the device conductance.

Figure 4F:
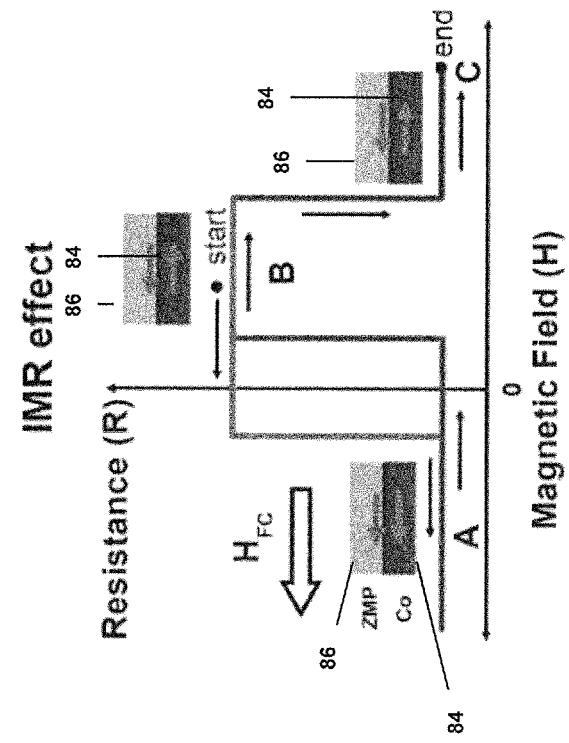
Figure 4E:
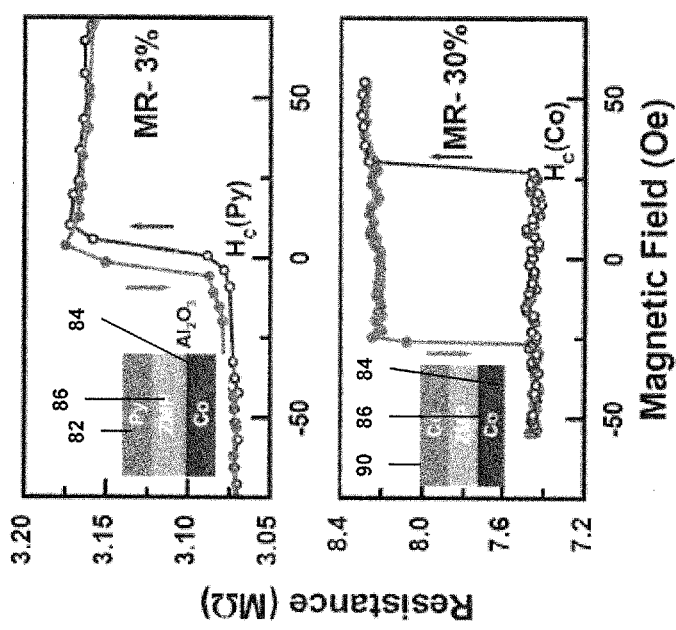

A set of measurements are carried out to confirm the origin of the IMR effect, as shown in FIG. 4E. First, a thin seed layer of alumina is inserted at the bottom interface between Co layer 84 and ZMP spacer layer 86. In this case, the bottom Co/ZMP interface does not show any MR response and a 3% MR for the top ZMP/Py interface is noted. Second, the top Py electrode 82 is replaced with Cu electrode 90. In this case, a large MR of close to 30% due to the bottom Co/ZMP interface is again observed. Third, there is no report of MR in Cu/ZMP/Cu structures due to possible bulk magnetism which confirms the hypothesis of an interface effect, as shown in FIG. 4F.

Figure 5B:
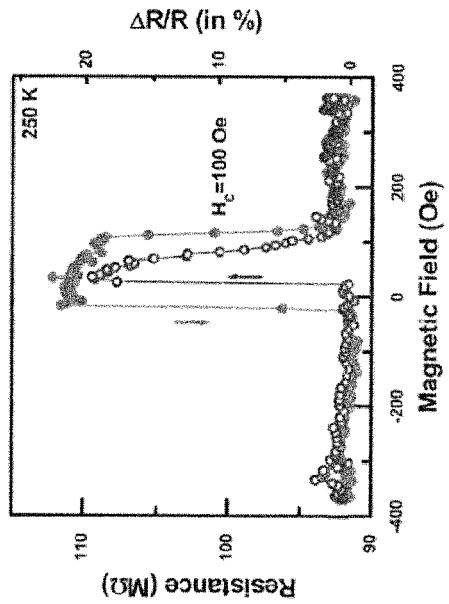
FIGS. 5A-5C are graphs illustrating the magnetoresistance of a magnetic molecular layer used in accordance with the invention.
Figure 5A:
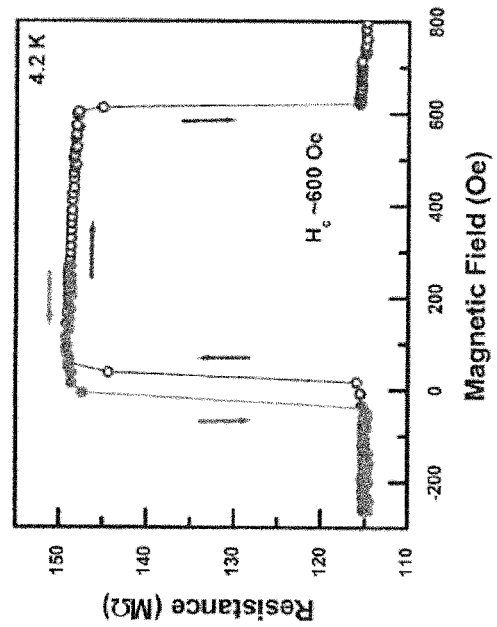
Figure 5C:
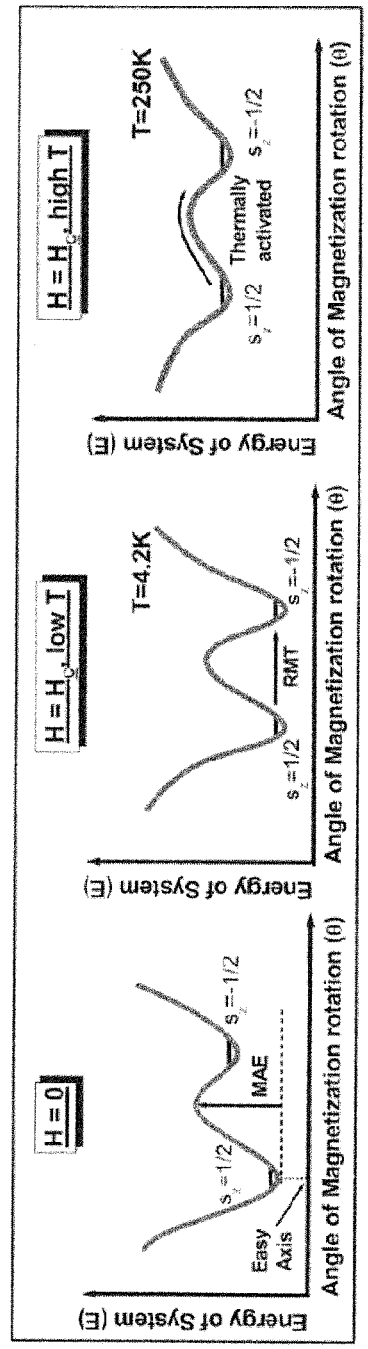

To characterize the interface magnetic layer, the OSV device 80 is subjected to higher magnetic fields. Here, the layer is found to switch at close to 600 Oe (switching field varied from device to device), bringing the device to the low resistance state, as shown in FIG. 5A. The high field switching of the interface magnetic layer suggests a large magnetic anisotropy. Cooling down the device in field induces a strong magnetic anisotropy in the interface layer with the easy axis along the field cooled direction. This is confirmed since it is possible to flip the IMR curve by cooling down the device in negative field. Interestingly, the IMR effect is observed even after warming up the device to close to room temperature. FIG. 5B shows an IMR of 22% for the bottom interface in the Co/ZMP/Py device. Here, the interface magnetic layer switches at ~100 Oe (from 600 Oe at 4.2 K) with the MR curve showing an asymmetric response with applied magnetic field. FIG. 5C shows the spin state being frozen in the easy axis (in-plane along the field cooled direction) and the reversal of magnetization under applied magnetic field occurs by the process of resonant magnetization tunneling (RMT) between the two quantum mechanical spin states of the magnetic molecule.

To investigate the origin of the IMR effect, ab initio calculations on the hybrid metal-organic interface have been performed. Spin-polarized first-principle calculations on the interface comprising the bottom Co (111) surface (5 layers) and either one or either two molecular layers of ZMP are carried out in the framework of density functional theory (DFT) by employing the generalized gradient approximation (PBE (21), for Co atom PBE+U, with Ueff=3.0 eV) in a projector augmented plane-wave formulation as implemented in VASP code. The simulations have been performed in a zero magnetic field and the structural relaxations included the van der Waals forces in a semiempirical approach.

Using a plane-wave energy cutoff of 500 eV in the ab initio calculations, the uppermost two Co layers and the molecules atoms are allowed to relax until the atomic forces are lower than 0.001 eV/A. The first ZMP molecule layer 98 absorbs flat with 6α-carbons and central carbon of the phenalenyl sitting directly on top of Co atoms 100, while the β-carbons of the phenalenyl sit in bridge position between the Co atoms 100, as shown in top and side views illustrated in FIG. 6A. The molecular plane is ~2.1-2.2 Å above the Co (111) surface 96 (the C atoms are ~2.1 Å; the 0 and Zn ones are ~2.2 Å away from the surface). Due to the planar structure of the molecule, the $p_z$ atomic type orbitals hybridize strongly with the d-states (mainly with $d_{z2}$, $d_{xz}$ and $d_{yz}$ orbitals) of the Co atoms 100 forming hybrid molecule-metal $p_z$-d interface states with bonding and antibonding character.

Figure 6A:
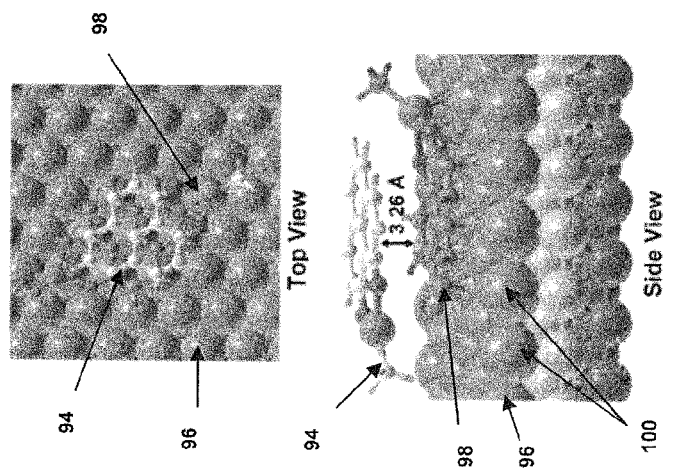
FIGS. 6A-6C are schematic diagrams an graphs illustrating properties of two spacer layers positioned on a ferromagnetic (FM) layer.
Figure 6B:
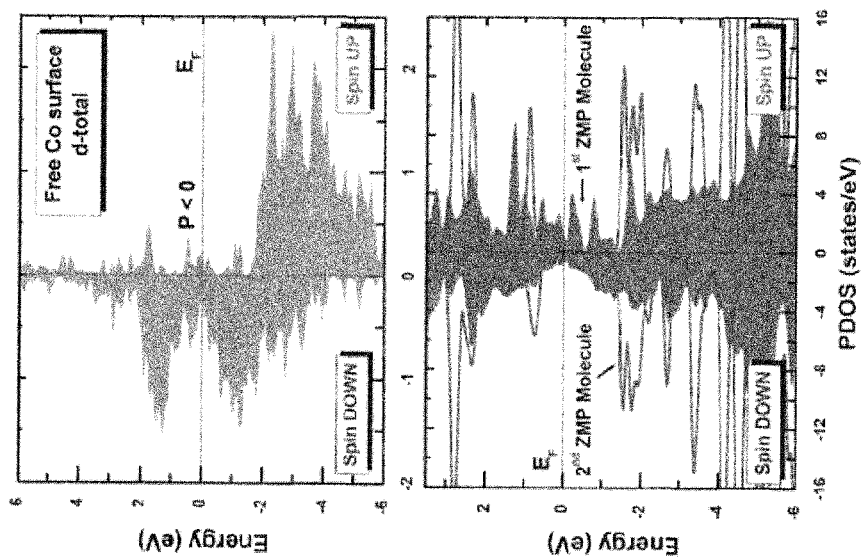

The calculated spin-resolved projected density-of-states (PDOS) for the clean Co (111) surface 100 and molecule is shown in FIG. 6B. Due to strong hybridization, the molecular energy levels of the first adsorbed ZMP molecule layer 98 are significantly broadened and became a component of the hybrid molecule-surfaces states. As a result of the spin dependent $p_z$-d hybridization, the molecule develops a spin-unbalanced electronic structure and acquires a net moment of 0.11 $\mu_B$ (calculated by only considering the spin density inside the atomic spheres of each atom of the molecule) oriented anti-parallel (spin-down direction, implying more spin-down electrons than spin-up electrons) to the moment of the bottom Co atoms 100 (1.93 $\mu_B$/atom, spin-up direction). Moreover, the ab initio calculations clearly point out that around the Fermi level the states with larger weight are in the spin-down channel at the clean Co surface atoms 100, while at the molecular site these states are in spin-up channel, suggesting an inversion of the spin polarization with respect to the clean surface at the Fermi level.

As compared to the free ZMP radical with one unpaired electron having a net magnetic moment of 0.33 $\mu_B$ (calculated by only considering the spin density inside the atomic spheres), a net magnetic moment 0.11 $\mu_B$ of the adsorbed ZMP molecule corresponds to 0.33 electrons, implying a partial radical molecular state. This partial radical interacts with a second layer 94 diamagnetic ZMP molecule (acceptor) due to an intermolecular π-π interaction giving rise to a special surface radical-cation or a donor-acceptor type π-dimer formation (paramagnetic with net spin). Such donor-acceptor interactions are shown to be energetically favorable and have a higher binding energy than a radical-radical type closed shell (diamagnetic) π-dimers.

The simulations of the hybrid interface show that that the second molecule layer 94 relaxes in a staggered configuration rotated by 180 degree with 6α-carbons and central carbon of the phenalenyl in the second molecule layer 94 sitting directly over the 6α-carbons and central carbon of the phenalenyl in the first molecule layer 98, FIG. 6A. The molecular plane is found to be ~3.26 Å above the first molecular layer 98 which is smaller than the sum of the van der Waals radii of the carbon atoms, suggesting a weak chemical bonding of the molecular π-dimer. The PDOS of the second ZMP molecule layer 94 resembles more the molecular-type discrete energy levels above and below the Fermi level, as shown in FIG. 6B.

Figure 6C:
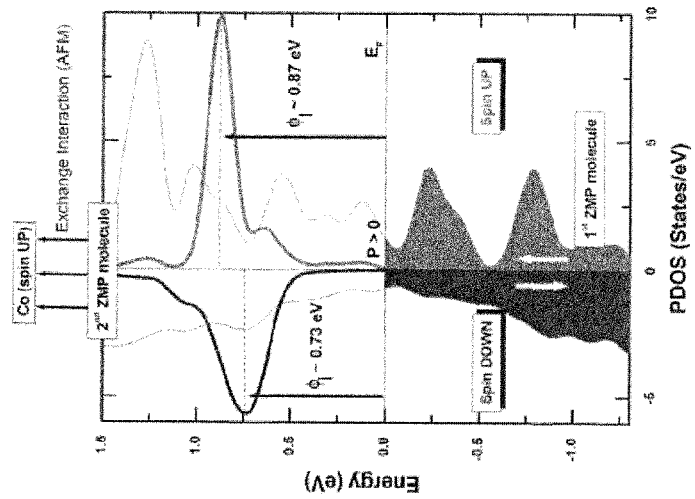

Although the calculations show that the second molecule layer 94 has no magnetic moment, the π-π interaction between the molecules creates a spin-unbalanced electronic structure in the second molecule. More importantly, the first energy level above the Fermi level (LUMO) is observed to be spin-split with a difference in energy of ~0.14 eV, as shown in FIG. 6C. Similar observations of an exchange splitting in the adsorbate bands on FM films due to surface hybridization have been reported earlier. However, the exchange splitting in the second ZMP molecule layer 94 can be understood to arise due to a special indirect exchange mechanism acting between the second molecule layer 94 and the underneath Co surface 96 mediated by the first ZMP molecule layer 98 through the π-π interaction. Such a mediated exchange interaction is suggested to have an AFM type nature i.e. the bottom Co electrode, having moment (1.93 $\mu_B$/atom) in spin-up direction, exchange splitting the LUMO level of the molecule with the spin-down level lower in energy than the spin-up level. This AFM type interaction has a unique feature: since the second molecule has no moment, there is no reason for this AFM type coupling to be broken in an applied magnetic field. Hence, the second ZMP molecule layer 94 always couples antiferromagnetically with the magnetization of the bottom Co electrode.

The spin splitting in the LUMO level of the second ZMP molecule layer 94 leads to a difference in the barrier height for injection (and/or tunneling) of the two spin channels during transport measurements, as shown in FIG. 6C. As a result, the molecule selectively screens a particular spin channel for injection (and/or tunneling), serving as a spin-filter layer. In the invention, the first ZMP molecule layer 98 having an asymmetric weight of the PDOS at the Fermi level for the two spin channel serve as the spin injector, while the spin-filter layer acts as the spin detector. Independent switching between these two layers leads to an IMR response.

Figures 7A, 7B, 7C:
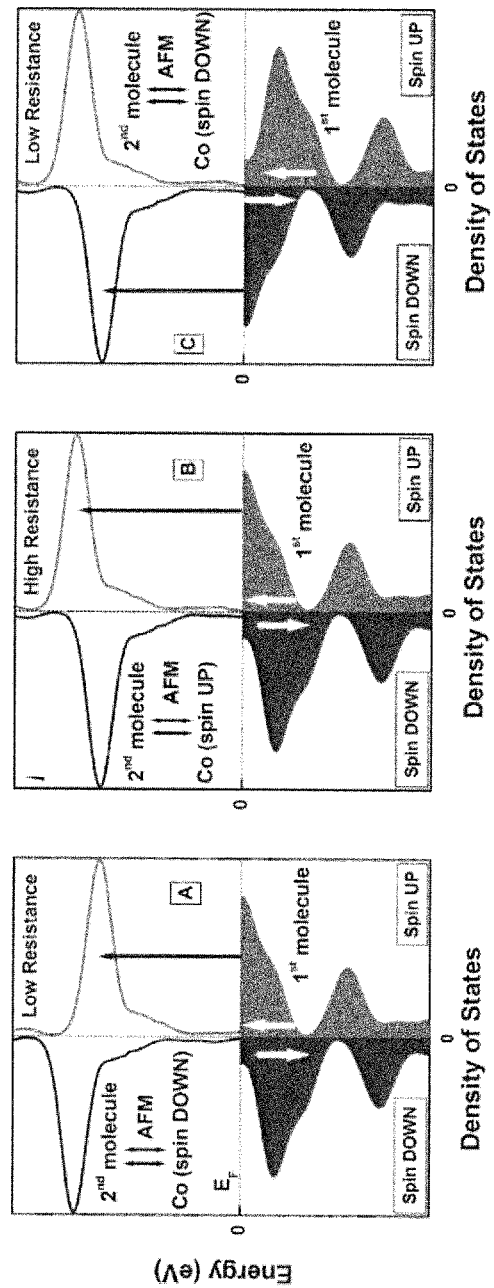
FIGS. 7A-7C are graphs illustrating the properties of the barrier height of a spin-up channel used in accordance with the invention.

FIG. 7A-7C are graphs explaining the IMR curve in such interface systems. In region A of FIG. 7A, the bottom Co electrode (majority electrons in spin-down, defined with respect to applied magnetic field) exchange splits the second layer molecule with the spin-up lowest unoccupied molecular orbital (LUMO) level lower in energy. This leads to reduction in the barrier height for the spin-up channel (having larger weight at EF) on the first molecular site. In region 13 of FIG. 7B, the bottom Co electrode switches its magnetization with spin-up electrons becoming the majority.

Hence, the spin-down LUMO level in the second layer molecule is now lowered in energy. As a result, the barrier height of the spin-up channel at the first molecular site increases which reduces the device conductance. At high fields, in region C of FIG. 7C, the switching of the first layer magnetic molecule inverts the PDOS weights of the spin channel at EF with spin-down having a larger weight. This brings the device back to the low resistance state. The above explanation provides a fundamental understanding to the origin of the IMR effect.

The observation of spin-filter effect up till close to room temperature suggests independent magnetization retention and high field switching of the first ZMP molecule layer 98. The source for such a magnetic response is not due to intermolecular magnetic exchange interaction that leads to the magnetization of domains, but due to an intrinsic molecular property giving rise to magnetic anisotropy. The hybridization of the surface Co atoms with the phenalenyl ring of the first ZMP molecule layer 98 gives rise interesting effects. Importantly, in our devices, the hybridized Co—ZMP system behaves as a high-spin molecular magnet and the strong intralayer exchange coupling on the (111) textured Co surface developing in-plane uniaxial anisotropy due to surface hybridization induced spin-orbit (S-O) coupling.

As a result of the above interface interactions, the adsorbed ZMP molecule behaves as an independent magnetic entity with an induced magnetic anisotropy. In comparison, no significant magnetic anisotropy is expected in a 'free' phenalenyl radical. Ab initio calculations are performed by including S-O coupling on a simple interface model system, comprising the π-dimer on Co (111) surface 96 (5 atomic layers), which confirms the presence of a strong magnetic anisotropy. For the above interface system, magnetic anisotropy energy (MAE) of ~2.2 meV in the out-of plane orientation (with respect to in-plane configuration) is noted. This MAE is relatively large compared to interface systems with other adsorbed molecules.

Experimental observation of the interface magnetism, close to room temperature, in the inventive device structure suggests a large MAE at least more than 22 meV (either due to in-plane or out-of plane rotation of magnetization) of the magnetic molecule layer. This large MAE arises due to S-O coupling, interface magnetic exchange mechanism or dipole-dipole interactions that become stronger by cooling down the device in a large magnetic field. It is observed that when the device is not cooled down in field, the IMR response is weaker suggesting a dependence of MAE on $H_{FC}$.

The magnetic switching behavior of the adsorbed magnetic molecule can be understood by making an analogy with SMMs that share a common origin of magnetic anisotropy (S-O coupling). At low temperatures (4.2 K), the MAE of the magnetic layer is much larger compared to the thermal energy (~364 μeV at 4.2 K) and the Zeeman energy at Hc (~$g\mu_B$ $H_c$=200 μeV). As a result, the spin state is frozen in the easy axis (in-plane along the field cooled direction) and the reversal of magnetization under applied magnetic field occurs by the process of resonant magnetization tunneling (RMT) between the two quantum mechanical spin states of the magnetic molecule, as shown in FIG. 5C. The RMT involves a hybrid mix of quantum tunneling with thermal relaxations which has been shown in high-spin SMMs ($Mn_{12}$ and $Fe_8$ systems), and can be extended to low-spin radical magnets such as the one in our study. At $H_c$, RMT is characterized by the sharp switching of the magnetization and device as shown in FIG. 5A. However, at higher temperatures (250 K), the magnetization switching is easily achieved by thermal relaxations causing a gradual change in device resistance and the asymmetric MR response, as shown in FIG. 5B.

The above study has the potential to open up new directions in exploring the role on interface hybridization in tailoring the magnetic anisotropy in nano-molecular radical systems for potential applications. Since, the radicals are metal-ion free, the spin-orbit coupling is relatively weak and hence spin coherence time can be much longer, ~tens of us in metal-ion free radical compared to ~hundreds of ns in metal-ion based SMMs. Further, they allow an easier way of encoding qubits for quantum computing. As a result, the use of such molecular systems is promising in data storage and communication, where a "bit" of information can be stored on a weakly interacting nanoscale molecule stabilized by the large magnetic anisotropy. Additionally, the large IMR effect allows the possibility to achieve high sensitivity and speed in sensing the information stored in these bits.

Although the present invention has been shown and described with respect to several preferred embodiments thereof, various changes, omissions and additions to the form and detail thereof, may be made therein, without departing from the spirit and scope of the invention.

What is claimed is:

1. A memory element for use in a memory storage device comprising:
    a single ferromagnetic (FM) layer having one or more ferromagnetic materials;
    one or more first molecule layers positioned on the FM layer where charge transfer and interface chemistry between the one or more first molecule layers and FM layer induces a magnetic moment in the one or more first molecule layers, the magnetic moment stored in the one or more first molecule layers acts as bit information that is retained or written into the one or more first molecular layers; and
    one or more spin-filter layers positioned on the one or more first molecule layers to form a physical or a chemical π-dimer layer structure.

2. The memory element of claim 1, wherein the one or more first molecule layers comprise magnetic or non-magnetic materials.

3. The memory element of claim 1, wherein the one or more first molecule layers comprise a planar molecule such as phenalenyl derivative or planar graphene fragment molecules.

4. The memory element of claim 1, wherein the FM layer comprises transition metal, alloy or oxides, sulphides with transition metals.

5. The memory element of claim 1, wherein the one or more spin-filter layers comprise the same or different materials as the one or more first molecule layers.

6. The memory element of claim 1, wherein the bit information is defined by the relative orientation between the one or more first molecule layers and the one or more spin-filter layers corresponding to a high or low resistance state.

7. The memory element of claim 1, wherein the memory storage device comprises a scanning tip that scans the memory element and maps resistance or current across the one or more spin-filter layers and the one or more first molecule layers.

8. The memory element of claim 7, wherein the scanning tip comprises non-magnetic materials.

9. The memory element of claim 7, wherein the scanning tip provides electric field or current density through the one or more spin-filter layers associated with the one or more first molecule layers so as to provide the proper orientation to write the bit information to the one or more first molecule layers.

10. The memory element of claim 9, wherein the memory storage device comprises a plurality of magnets to produce the magnetic field to that is applied to the FM layer which orients the one or more spin-filer layers along the direction parallel to the orientation of the bit information to be stored in the one or more first molecule layer, the magnets are positioned to be either attached with the scanning tip or be part of a substrate.

11. A method of forming a memory element for use in a memory storage device comprising:
    providing a single ferromagnetic (FM) layer having one or more ferromagnetic materials;
    forming one or more first molecule layers that is positioned on the FM layer where charge transfer and interface chemistry between the one or more first molecule layers and FM layer induces a magnetic moment in the one or more first molecule layers, the magnetic moment stored in the one or more first molecule layers acts as bit information that is retained or written into the one or more first molecular layers; and bonding the one or more spin-filter layers to the one or more first molecule layers to form a physical or a chemical π-dimer layer structure.

12. The method of claim 11, wherein the one or more first molecule layers comprise magnetic or non-magnetic materials.

13. The method of claim 11, wherein the one or more first molecule layers comprise planar molecules such as phenalenyl derivative or planar graphene fragment molecules.

14. The method of claim 11, wherein the FM layer comprises transition metal, alloy or oxides, sulphides with transition metals.

15. The method of claim 11, wherein the one or more spin-filter layers comprise the same or different materials as the one or more first molecule layers.

16. The method of claim 11, wherein the bit information is defined by the relative orientation between the one or more first molecule layers and the one or more spin-filter layers corresponding to a high or low resistance state.

17. The method of claim 11, wherein the memory storage device comprises a scanning tip that scans the method and maps resistance or current across the one or more spin-filter layers and the one or more first molecule layers.

18. The method of claim 17, wherein the scanning tip comprises non-magnetic materials.

19. The method of claim 17, wherein the scanning tip provides electric field or current density to the one or more spin-filter layers associated with the one or more first molecule layers so as to provide the proper orientation to write the bit information to the one or more first molecule layers.

20. The method of claim 19, wherein the memory storage device comprises a plurality of magnets to produce the magnetic field to that is applied to the FM layer which orients the one or more spin-filer layers along the direction parallel to the orientation of the bit information to be stored in the one or more first molecule layer, the magnets are positioned to be either attached with the scanning tip or be part of a substrate.

21. A method of storing bit information in a memory element comprising:

providing a single ferromagnetic (FM) layer having one or more ferromagnetic materials;

inducing a magnetic moment in one or more first molecule layers that are positioned on the FM layer through charge transfer and interface chemistry between the one or more first molecule layers and FM layer, the magnetic moment stored in the one or more first molecule layers acting as said bit information that is retained or written into the one or more first molecule layers; and bonding the one or more spin-filter layers to the one or more first molecule layers in order to form a physical or a chemical π-dimer layer structure.

22. The method of claim 21 further comprising providing a memory storage device having a scanning tip that scans the memory element and maps resistance or current across the one or more spin-filter layers and the one or more first molecule layers.

23. The method of claim 22, wherein the scanning tip provides electric field or current density to the one or more spin-filter layers associated with the one or more first molecule layers so as to provide the proper orientation to write the bit information to the one or more first molecule layers.

24. The method of claim 23, wherein the memory storage device comprises a plurality of magnets to produce the magnetic field to that is applied to the FM layer which orients the one or more spin-filer layers along the direction parallel to the orientation of the bit information to be stored in the one or more first molecule layer, the magnets are positioned to be either attached with the scanning tip or be part of a substrate.

\* \* \* \* \*